United States Patent [19]
Frame

[11] Patent Number: 5,393,971
[45] Date of Patent: Feb. 28, 1995

[54] RADIATION DETECTOR AND CHARGE TRANSPORT DEVICE FOR USE IN SIGNAL PROCESSING SYSTEMS HAVING A STEPPED POTENTIAL GRADIENT MEANS

[75] Inventor: Wayne W. Frame, Longmont, Colo.
[73] Assignee: Ball Corporation, Muncie, Ind.
[21] Appl. No.: 77,175
[22] Filed: Jun. 14, 1993
[51] Int. Cl.$^6$ .......................................... H01J 40/14
[52] U.S. Cl. ................... 250/208.2; 358/475; 377/63
[58] Field of Search ............... 250/208.1, 208.2, 214.1, 250/214 LS, 214 PR, 216; 356/4, 5; 358/475, 476; 377/58, 60, 62, 63, 68, 53

[56] References Cited
U.S. PATENT DOCUMENTS

| | | |
|---|---|---|
| 3,689,772 | 9/1972 | George et al. |
| 3,728,590 | 4/1972 | Kim et al. .................. 317/235 R |
| 3,906,359 | 9/1975 | Blaha et al. .................. 324/43 R |
| 3,913,077 | 10/1975 | Erb .................................. 377/63 |
| 4,127,766 | 11/1978 | Thayer ......................... 235/92 PK |
| 4,270,060 | 5/1981 | Pines et al. .................. 307/221 D |
| 4,348,690 | 9/1982 | Jastrzebski et al. ............... 358/44 |
| 4,479,139 | 10/1984 | Parrish . |
| 4,627,722 | 12/1986 | Falk et al. . |
| 4,757,365 | 7/1988 | Boudewijns . |
| 4,799,109 | 1/1989 | Esser et al. .................. 358/213.28 |
| 4,857,751 | 8/1989 | Hatanaka et al. ............... 250/208.1 |
| 4,951,106 | 8/1990 | Blouke . |
| 4,989,060 | 1/1991 | Usui . |
| 4,995,061 | 2/1991 | Hynecek .......................... 377/58 |

OTHER PUBLICATIONS

Hayes, et al., Dual-Channel Charge-Coupled Device for High Speed Signal Acquisition, 26(9) Optical Engineering, pp. 829–836, Sept. 1987.

Brian C. Kennedy, CCD Detector Study for the National Science Foundation, Final Report, Jan. 1988, pp. 1–18.

Primary Examiner—David C. Nelms
Assistant Examiner—Que T. Le
Attorney, Agent, or Firm—Gilbert E. Alberding

[57] ABSTRACT

A charge transport apparatus for use in a signal information system (10) is disclosed. The apparatus includes a detector (18), having a number of radiation sensitive elements (24), for receiving a radiation signal (14) and generating electrical charge responsive to the received signal (14). The resulting charge is conveyed to a readout port area (32) by impressing a stepped potential gradient or a potential field with a varying sweep rate on the detector (18). The stepped potential gradient or variably swept potential field is communicated to the detector (18) via underlying tines (38).

45 Claims, 9 Drawing Sheets

RADIATION DETECTOR AND CHARGE TRANSPORT DEVICE FOR USE IN SIGNAL PROCESSING SYSTEMS HAVING A STEPPED POTENTIAL GRADIENT MEANS

BACKGROUND OF THE INVENTION

1. Field of the Invention

The present invention generally relates to signal processing systems and, in particular, to an apparatus for detecting a radiation signal and transporting an electric charge that is generated in response to the detected radiation signal to a readout port where the charge can be provided to a signal analyzer or other circuitry.

2. Description of the Related Art

Signal processing systems are employed in a variety of applications. Such systems include communications systems in which a signal transmitter and receiver cooperate to communicate information and sensing systems in which dimensional, positional or other information regarding an object is determined based on analysis of a signal emitted by, reflected by or transmitted through the object. Other signal processing applications include telemetry and telescopy systems, imaging systems, systems for precise measurements of wavelength, velocity and very small distances or thicknesses, rangefinding and guidance systems and a variety of other sensing and communications systems.

All signal information systems include a transmitter that outputs a signal and receiver for receiving the signal output by the transmitter and deriving information from the signal. Generally, the receiver has a detector for detecting the signal and generating charge carriers, i.e., electrons or holes, representative of the signal and an analyzer for processing the information contained in the representative charge. Solid state detectors such as charge-coupled devices (CCDs) have been favored for many applications because of their high quantum efficiency and low noise. The receiver also includes a mechanism for conveying the resulting charge from the detector, radiation sensitive area, to a readout port where it can be provided to an analyzer or other appropriate signal processing circuitry.

Representative of the problems present in many applications that employ receivers and, in particular, receivers that employ CCD technology are the applications in which the location on the detector where particular charges are generated and/or the time when particular charges are generated are important. An example of the former situation is a detector/charge transport mechanism used to resolve a circular radiation pattern produced by an interferometer. In one known type of dector/charge conveyance mechanism for use with an interferometer, a layer of resistive material positioned on a curved detector surface is utilized to convey charge from the detector to the readout port. A DC potential source is connected to terminal portions of the resistive material to produce an electric field which assists in charge conveyance. This configuration of detector and charge conveyance system has many drawbacks. Specifically, critical areas of the radiation pattern, such as the center, cannot be detected. Additionally, current flowing through the resistive layer can result in production of thermally-generated electrons which can interfere with accurate signal detection. Moreover, dark current accumulation, a type of noise that is especially troublesome when the receiver is used to detect low level signals over a long period of time, is a problem on such a receiver. Furthermore, the capacitance of such a configuration can adversely affect the response time of the receiver and thereby limit the application in which the configuration can be used. In addition, due to the materials used in this configuration, fabrication of the detector/charge conveyance mechanism is difficult.

A proposed alternative detector/charge conveyance mechanism for use in an interferometer also poses a number of difficulties. The proposed detector/charge conveyance mechanism includes a detector that is divided into a multiplicity of charge collection sub-areas or pixels, such that each sub-area generates a "packet" of charges representative of the radiation incident on the sub-area. The collected charge packets are periodically read out by clocking the charge packets across the detector surface to a readout port. That is, the charge packets are shifted from one collection sub-area to the next enroute to the readout port by a conventional, clocked shift register. The signal pattern can then be determined based on the sequentially read charge packets. Although such a mechanism theoretically allows for adequate signal resolution, in practice, such a mechanism is relatively complicated to fabricate and often entails complex data processing to derive the desired signal information.

An example of an application in which the time when the detector generates charges is important is a rangefinding system that operates on a radiation transit time principle. In such systems, the range of an object is determined based on the time at which a signal or signals are received by the detector without regard to the location of signal incidence on the detector. In a rangefinder, it is desirable to transfer the charge generated by the detector at a high clocking rate so that the time of signal incidence on the detector and, hence, the range of an object can be accurately determined. For example, the detector may be a typical square or rectangular pixel of a linear CCD array associated with a clocked shift register such that the time of signal incidence is represented by the position of charge within the array at the end of a selected cycle. However, because the maximum clocking rate of such a pixel is inversely related to the size of the pixel, the maximum size of the detector is limited by the desired clocking rate. The size of the detector can, in turn, limit overall signal information system performance.

Based on the foregoing, it is apparent that a new detector/charge transport method and apparatus for use in various signal processing systems is needed. Desirably, such a mechanism should be adaptable for use in location-specific and/or time-specific detection applications and should alleviate or avoid the difficulties discussed above.

SUMMARY OF THE INVENTION

Accordingly, objectives of the present invention include the following:

The provision of an improved detector/charge transport method and apparatus.

The provision of a detector/charge transport method and apparatus which is adaptable for use in time-specific and/or location-specific detection applications.

The provision of a detector/charge transport method and apparatus which provides charge conveyance with reduced production of thermally generated electrons.

The provision of a detector/charge transport method and apparatus which is able to detect incident radiation in areas that known devices are incapable of or limited in detecting a radiation signal.

The provision of a detector/charge transport device that is relatively easy to construct.

The provision of a detector/charge transport method and apparatus which provides for location-specific detection with simplified data processing.

The provision of a detector/charge transport method and apparatus that employs a large area detector and may be used in an application that requires detection of a low level signal over a long integration period.

The provision of a detector/charge transport method and apparatus in which a large detector can be utilized in connection with a high frequency readout mechanism.

Additional objectives and corresponding advantages will be apparent to one skilled in the art upon consideration of the description below.

According to one aspect of the present invention, detector/charge transport apparatus for use in a signal processing system comprises a detector for receiving a radiation signal and generating electrical charge in response to the received radiation signal. The detector covers a defined charge producing area and includes a readout port for use in communicating the electrical charge to an analyzer or other appropriate circuitry. The apparatus further comprises a charge conveyance mechanism for producing a stepped potential gradient to convey charge towards the readout port. That is, the charge conveyance mechanism produces a potential gradient in which the potential gradient includes at least one "step" or location where the potential gradient changes abruptly from a first potential to a second potential.

The recognition that a stepped potential gradient can be employed for charge transport allows for use of a variety of charge transport mechanisms. For example, a stepped potential gradient can be produced using a voltage divider located outside of the charge producing area. The stepped potential gradient can then be impressed on the charge producing area by tapping the voltage divider at different locations, each location providing a different voltage or potential, and then apply the different potentials to the charge producing area of the detector via a plurality of electrode members that underlie the charge collection area. Alternatively, the stepped potential gradient can be produced by applying a voltage across terminal portions of a resistive, serpentine element which traverses the charge producing area of the detector so that differing potentials are impressed on the charge producing area at the location of each traverse.

In another embodiment of the invention, a detector/charge transport mechanism is provided that includes a detector for receiving a radiation signal and, in response, producing an electrical charge that is representative of the radiation signal. The detector includes a readout port that permits the electrical charge to be transferred to other circuitry, such as an analyzer. Also included in the mechanism is a charge transport mechanism that applies a potential field that sweeps across the detector and towards the readout port at a varying rate to, in turn, sweep charge towards the readout port. By using a varying rate, situations in which the charge must travel a path to the readout port that is transverse (and especially where the path is nearly perpendicular) to the direction of the potential field can be accommodated. In such a situation, the potential field tends to drive the electrical charge into a border of the detector and less along a path leading to the readout port. By sweeping the potential field more slowly in areas where the path is more transverse to the direction of the potential field, the charge is given time to reach the readout port. This is especially useful in applications in which the detector employs a curved pixel, such as in a detector for an interferometer that employs a plurality of curved, annular pixels that require the charge to traverse a curved path to reach the readout port. In one embodiment, the desired potential field is achieved by applying a clocking signal to substantially equally spaced tines or electrodes that underlie the detector and appropriately varying the rate of the clocking signal. In another embodiment, a constant rate clocking signal is applied to tines or electrodes that underlie the detector and are more closely spaced or denser in the areas where the path charge must travel is more transverse to the field.

In yet a further embodiment of the invention, a detector/charge transport mechanism is provided that includes a detector for converting a received radiation signal into a representative electrical charge. The detector includes a plurality of pixels that are at least partly annular and some of which are concentric relative to other of the annular pixels. This detector configuration is of particular use in detecting the fringe pattern produced by an interferometer. Further included in the mechanism is a device for applying a potential or electrical field to the detector to drive the accumulated charge toward a readout port that includes a plurality of electrodes that underlie the detector. In particular embodiments, signal charge can be clocked across the detector at a varying rate or a stepped potential gradient can be used to sweep the charge across the detector.

DETAILED DESCRIPTION

Figure 1:
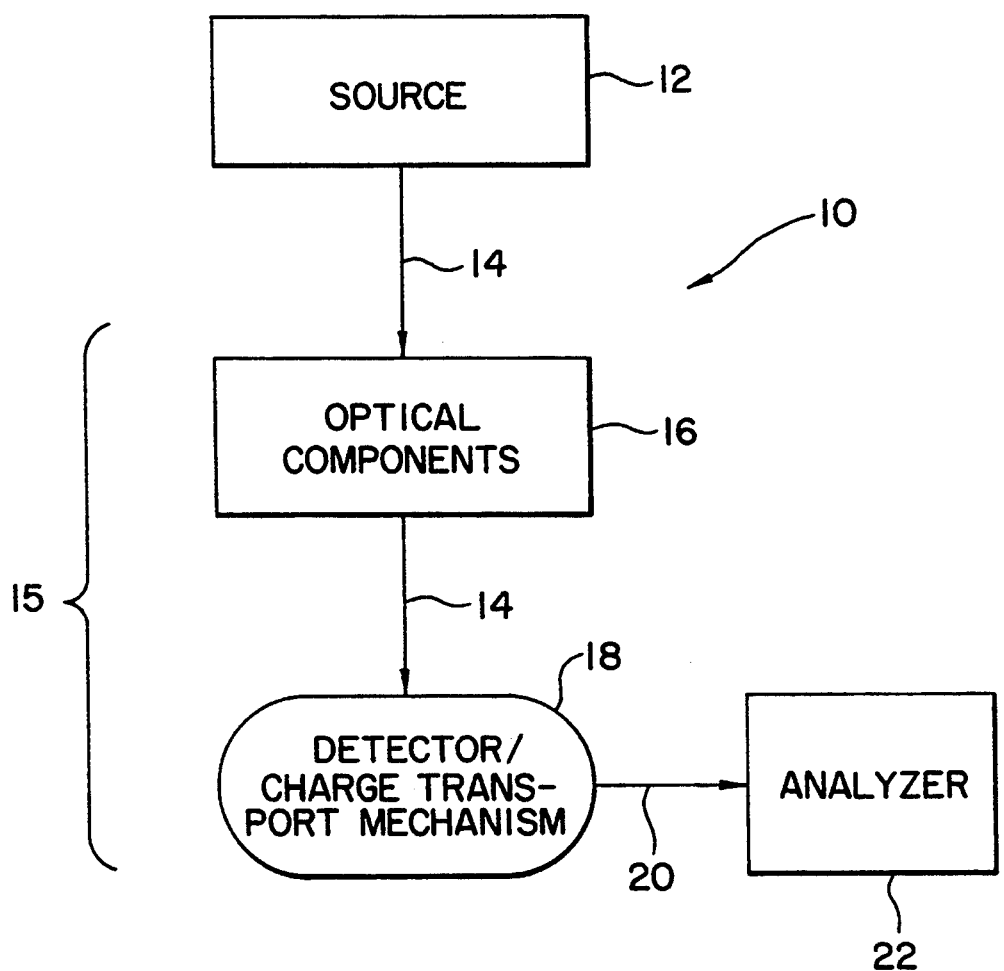
FIG. 1 is a schematic representation of a signal information system that embodies the present invention.

Referring to FIG. 1, a signal processing system embodying the present invention is generally identified by the reference numeral 10. The system 10 comprises a source or transmitter 12 of a radiation signal 14, e.g., light; and a receiver 15 comprised of optical components 16, such as collimators, lenses, filters, interferometers and the like, for optically processing the signal 14; a detector/charge transport mechanism 18 for transducing the signal 14 into an electrical output signal 20 representative of the received radiation signal 14; and an analyzer 22, such as a microprocessor or other data processor, for receiving the electrical output signal 20 and deriving information therefrom.

In the illustrated embodiment, the optical components 16 include a conventional Fabry-Perot interferometer. The interferometer resolves the radiation signal 14 into the well-known Fabry-Perot interference pattern of circular, concentric fringes which can be analyzed to yield information regarding the frequency components of the radiation signal 14. In such analysis, the radial profile of the fringe pattern is of primary importance as there is normally little or no systematic angular variation in radiation intensity.

Figure 2:
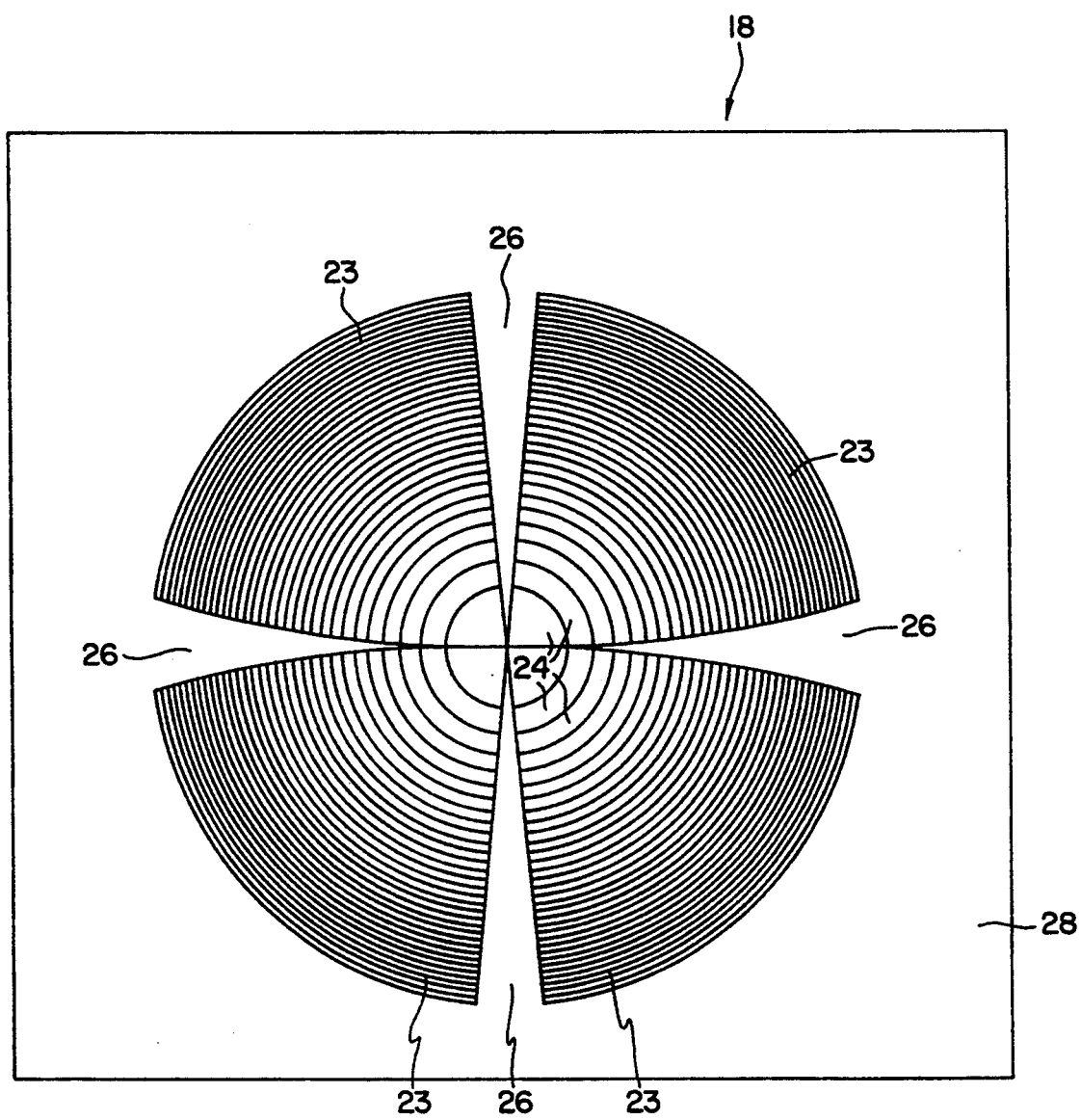
FIG. 2 is a top view of a detector/charge transport mechanism constructed in accordance with the present invention.

Referring to FIG. 2, a top view of an embodiment of the detector/charge transport mechanism 18 for use with a Fabry-Perot interferometer is shown. The detector/charge transport mechanism 18 includes a detector portion 23 for receiving the concentric, fringe pattern, radiation signal output by the Fabry-Perot interferometer and converting the signal into a representative electrical signal. The detector portion 23 includes a number of part-annular radiation sensitive elements 24 with four of the elements forming each of the substantially annular rings of the detector portion 23. Each of the substantially annular rings is of substantially equal area to normalize that portion of the concentric, fringe pattern radiation signal detected by each annulus. The four elements 24, each extending over an arc of slightly less than 90°, that form each annulus provide the requisite radial resolution as well as limited angular resolution, which may be useful in aligning the detector portion 23 with the optical components. (Limited angular resolution such as is realized by a quad cell). Further, the slightly less than 90° arc covered by each element provides a shorter path for charge to travel in reaching a readout port than elements which cover a greater arc. As a consequence the detector portion 23 is more responsive. If alignment and path length are less critical in a particular application, then two elements 24 can be used to form each annulus. In this case, each element 24 typically extends over an arc of slightly less than 180°. A variety of semi-conductor devices, including various silicon, gallium arsenide and germanium devices, for generating charge carriers in response to incident radiation are suitable for use in constructing the radiation sensitive elements 24. In the illustrated embodiment, the radiation sensitive elements 24 comprise conventional silicon-silicon oxide charge coupled devices (CCD).

The detector portion 23 is located in a focal plane of the interferometer such that the fringe pattern produced by the interferometer is concentrically disposed on the part annular elements 24. In this manner, the profile of individual fringes is represented by charge accumulation in the corresponding element(s) 24. It has been found that about 4–5 annuli per fringe provides adequate resolution for most applications. In this regard, an adequate detector/charge transport mechanism 18 can include about 30 to 50 annuli with an overall active detector surface diameter of about 1 cm. The elements 24 can be formed in semi-circular, quarter-circular or other part annular shapes. The illustrated detector includes 32 equal area elements 24 in each of four detector quadrants formed on a 1 cm diameter surface.

Ideally, each annulus of the detector position 23 would extend over a 360° arc to produce an electrical charge that is representative of the energy content of a particular fringe. However, this would preclude access to a readout port for transferring the electrical charge generated by the inner annuli. It is believed that coverage of about 85% of the fringe pattern provides adequate signal detection for most applications. Consequently, the remaining 15% can be used to transfer the charge produced by each of the annuli comprising the detection portion 23 to a readout port. The 15% is radially distributed, i.e., so that the resulting loss is not concentrated on radial regions corresponding to particular fringes. The illustrated elements 24 are arranged in quadrants separated by wedges 26 which cover about 15% of the active receiver surface and whose area is used in conveying charge to a readout port. The wedges 26 and the area of the detector portion 23 adjacent to the elements 24 comprising the outermost annulus of the detector portion 23 are covered by a radiation shield 28, formed from substantially radiopaque material, to reduce extraneous charge generation which could interfere with accurate signal detection.

Figure 3:
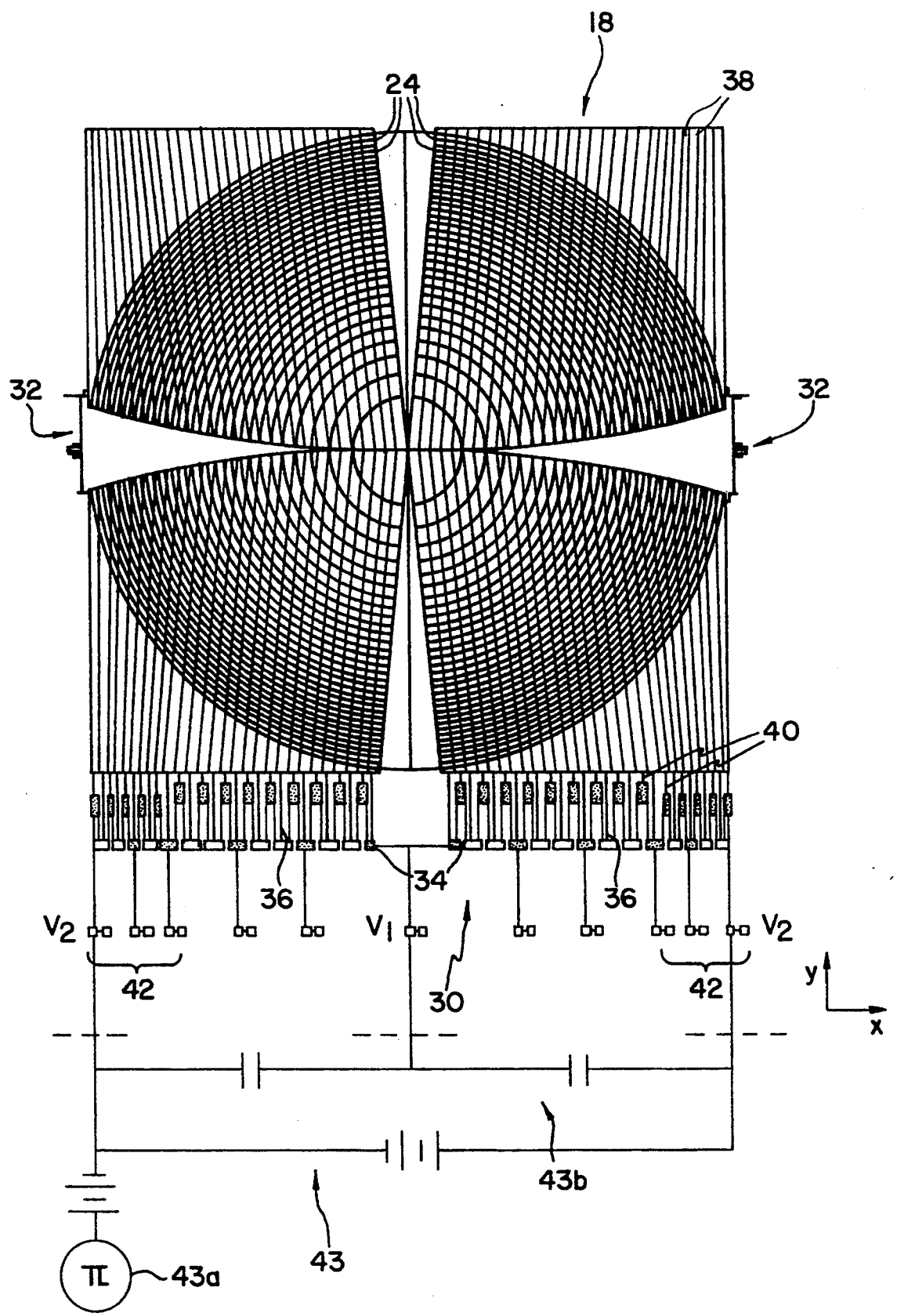
FIG. 3 is a top view of a portion of the detector/charge transport mechanism of FIG. 2 showing the charge conveyance mechanism.

Referring to FIG. 3, the detector portion 23 (less the shield 26) as well as a charge transport portion 30 for conveying charge from the elements 24 towards the readout port areas 32 is illustrated. More specifically, the charge transport portion 30 cause the charge produced by each of the elements 24 to be conveyed to one of the readout ports 32 for subsequent analysis to resolve the fringe pattern. This is accomplished by conveying charge longitudinally across each element 24 to an end thereof adjacent the readout port areas 32. In the embodiment of FIGS. 2–6, the charge transport portion 30 provides a stepped potential gradient that forces the charge produced by each of the elements 24 to travel towards one of the readout port areas 32.

In the illustrated embodiments, the charge transport portion 30 uses a voltage divider 34 in establishing the stepped potential gradient. The voltage divider 34 is laterally displaced from the elements 24 to reduce thermally induced charge generation in the detector portion 23. The voltage divider 24 is comprised of two serpentine polysilicon resistors 36 each having a first voltage, $V_1$, applied to an inner end thereof and a second voltage, $V_2$, applied to an outer end thereof. The second voltage, $V_2$, is greater (more positive) than the first voltage, $V_1$. By tapping the resistors 36 at different nodes 40, a plurality of substantially discrete potentials or voltages that increase from the inner end of each resistor 36 towards the outer end is achieved. The substantially discrete potentials or voltages are communicated to the elements 24 of the detector portion 23 via polysilicon electrodes or tines 38 connected at nodes 40 along the serpentine structure 36. The resulting stepped potential gradient urges charge in each element 24 towards the associated readout port area 32. The voltage divider, when each annuli is comprised of two elements 24 and only one readout port is necessary, need only be a single resistor structure.

The voltage divider 34 and tines 38 are formed from sequentially deposited polysilicon layers, generally identified by alternating shading in the figures. Likewise, the detector portion 23 is formed from polysilicon. As a consequence, the detector/charge transport mechanism 18 can be readily produced.

The configuration of the tines 38 is selected to facilitate charge transport. Specifically, the resulting potential gradient vector is generally perpendicular to the longitudinal axis of the tines 38. It is therefore desirable to slant the tines 38 relative to the direction any charge must travel to provide both a side-to-side or x-component and a top-to-bottom (or vice versa) or y-component of the potential gradient vector and thereby facilitate charge transport to the readout port areas 32. This is especially useful because the charge must travel in a y-direction, due to the curvature of the elements 24, to reach one of the readout ports 32. Additionally, when two elements per annulus are used, slanting the tines 38 to form a chevron pattern in which the tines adjacent the ends of the elements 24 furthest from the single readout port is especially useful in facilitating the transporting of charge present at the noted end of the element 24.

The width of the tines 38 is also important in facilitating charge transport. Specifically, for a given overall voltage across one of the resistors 36, which voltage may be selected to be compatible with output circuitry and related components, charge transport velocity decreases as tine width increases. In the illustrated embodiment, it has been found that charge transport velocity reduces markedly for tine widths in excess of about 60 $\mu$m. The illustrated tines 38 therefore have a width of about 30 $\mu$m–60 $\mu$m. In this regard, the pitch of the serpentine structure 36 is reduced, e.g., from 30 $\mu$m to 20 $\mu$m, at outer end portions 42 thereof adjacent the readout port areas 32 so that the tines adjacent the readout circuitry are flush with the readout circuitry.

With continuing reference to FIG. 3, the size of each element 24 is relatively large. While this improves the signal-to-noise ratio (SNR) of each element, there is also the potential for dark current accumulation (the charge/current produced by the elements 24 in the absence of a radiation signal), especially if the mechanism 18 is to be used in a low signal level application requiring a long integration period. To address this problem, the mechanism 18 includes dark current circuitry 43 for reducing the adverse effects of dark current accumulation. The circuitry 43 operates to produce a surplus of holes, if the detector portion 18 is comprised of n-channel elements, at the silicon-silicon oxide interface of the elements 24 during the integration period when the detector portion 23 is receiving a radiation signal and generating signal charge. The surplus of holes, in effect, changes or inverts the n-type material to a p-type material at the surface. (For a p-channel embodiment, a surplus of electrons would be used to invert the p-type material to an n-type.) The circuitry 43 includes a pulse generator 43a for pulsing the potential of the voltage divider 34 during the integration period to reduce the dark current generation rate. For an integration period on the order of 125 milli-seconds, the pulse generation 43a initially reduces the potential across the voltage divider 34 to invert the surface of elements 24. A few milli-seconds before the end of the integration period, the pulse generation 43a establishes the necessary voltage across the voltage divider 34 to establish the desired stepped potential gradient for conveying the charge in each element 24 towards the readout port areas 32. The circuitry 43 further includes a capacitor divider 43b to reduce the electrical time constant of the centrally located tines 38. Alternatively, a resistor divider can be used to reduce the electrical time constant. This scheme or mode of operation reduces the dark current contribution of surface trapping states potentially present in the detector portion 23 during signal integration.

Figure 4:
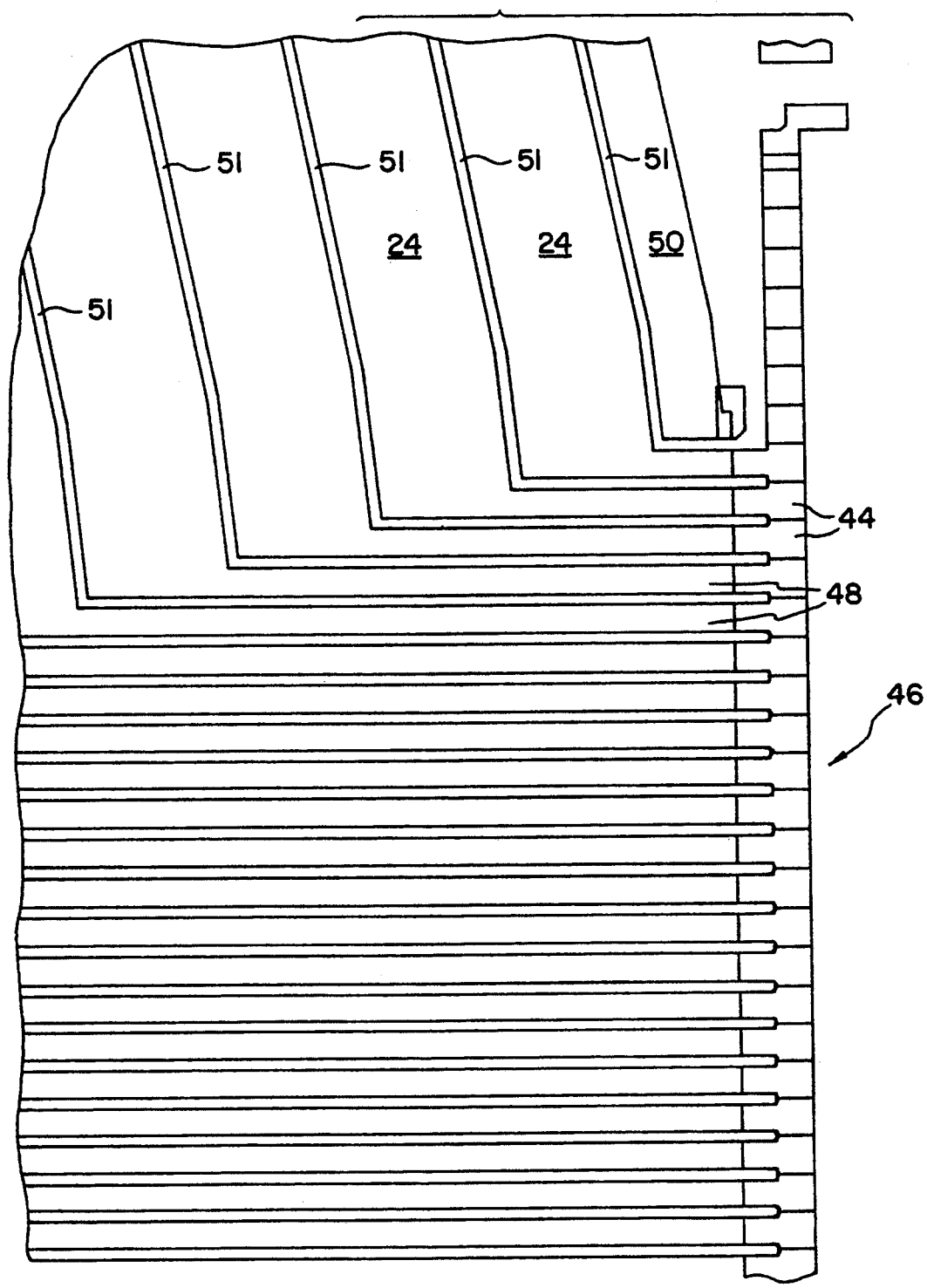
FIG. 4 is an enlarged, detail illustration of the readout portion of the detector/charge transport mechanism of FIG. 2.

Referring to FIG. 4, an enlarged, detail illustration of a portion of the right readout port area 32 is shown. A mirror image readout port area 32 is provided at the left side of the detector/charge transport mechanism 18. Each of the elements 24 communicates with a separate cell 44 (each of which is less than about 20 $\mu$m wide) of a polysilicon serial readout register 46 via a channel 48. Specifically, the charge transport mechanism 30 urges charge towards the register 46, and separate collector and transfer gates or the like are utilized to collect and transfer charge to the register 46 at the end of an integration period. The resulting charge packets are then clocked in conventional cell-to-cell fashion from the register 46 for processing by the signal analyzer 22 (FIG. 1) to obtain information from the signal 14. A guard band drain channel 50 that extends about the periphery of the active receiver area to inhibit charge migration from outside the detector area. Channel stops 51 that define the lateral extents of each of the elements 24 and inhibit charge migration between the elements 24 are also shown in FIG. 4.

Figure 5:
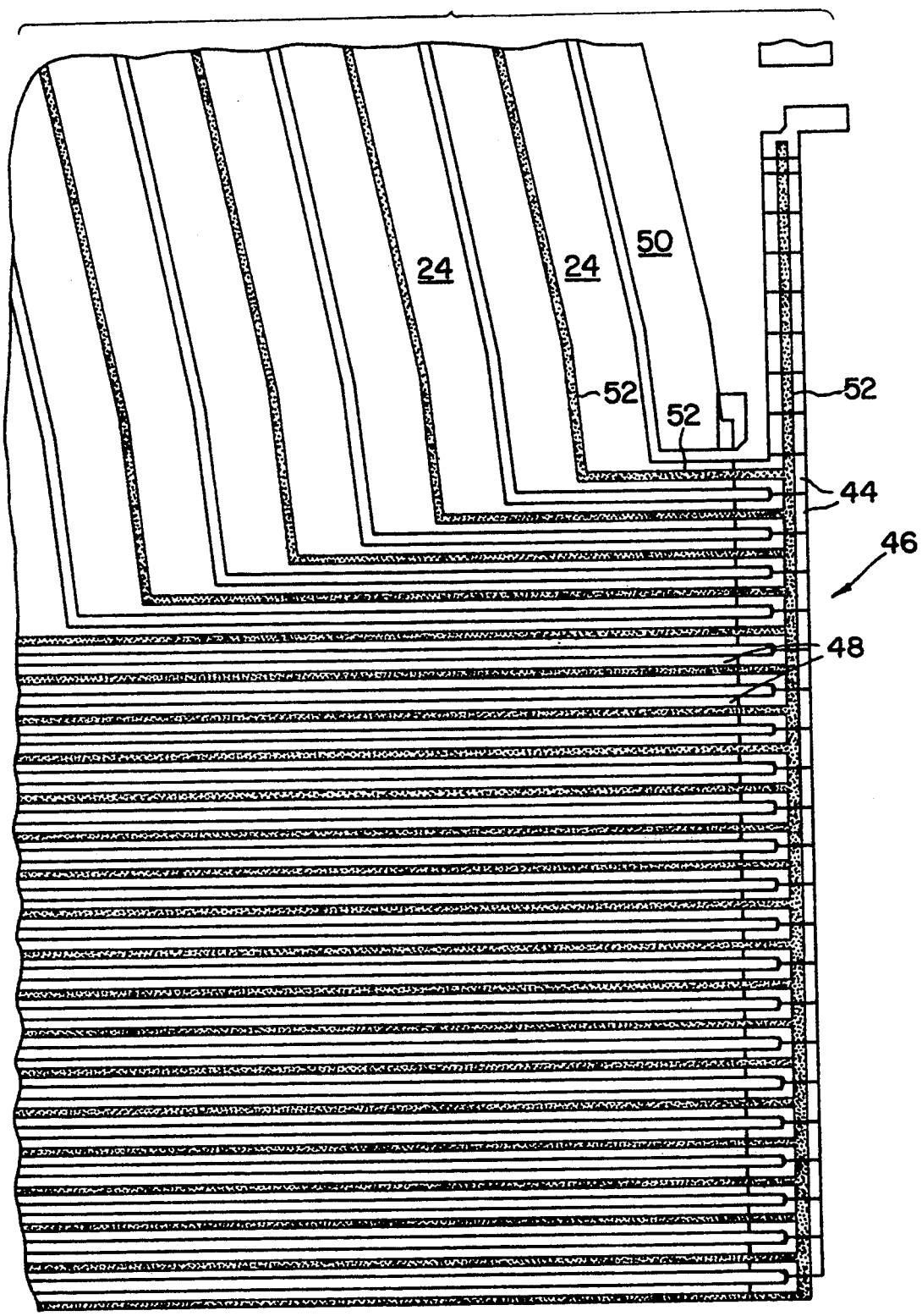
FIG. 5 is an enlarged, detail illustration of the readout portion of the detector/charge transport mechanism of FIG. 2 showing the optional mini-channels or notches.

In FIG. 5, in the elements 24, channels 48 and register 46 to facilitate charge transport. The notches 50 comprise areas that are centered between the channel stops 51 defining the lateral extents of each of the elements 24, channels 48 and register 46 and are more heavily doped than the remainder of the element, channel or register. As a result of the higher doping, the notches 52 have a higher potential than the remainder of the structure with which they are associated. This, in turn, reduces the probability of the charge produced by the elements 24 encountering trapping sites and hence increases charge transport efficiency. This reduced probability is primarily attributable to the reduced volume of the notch relative to the volume of the channel. The use of the mini-channels 52 is especially useful in applications involving low signal levels. To reduce the path length that charge must travel at nearly a right angle to the potential field, the mini-channels 52 are slanted relative to the potential field provided by the tines. This is especially useful when the field is oriented to primarily cause charge to migrate to the x-direction but the portion of the element that the charge must traverse is primarily oriented in the y-direction or vice versa.

Figure 6:
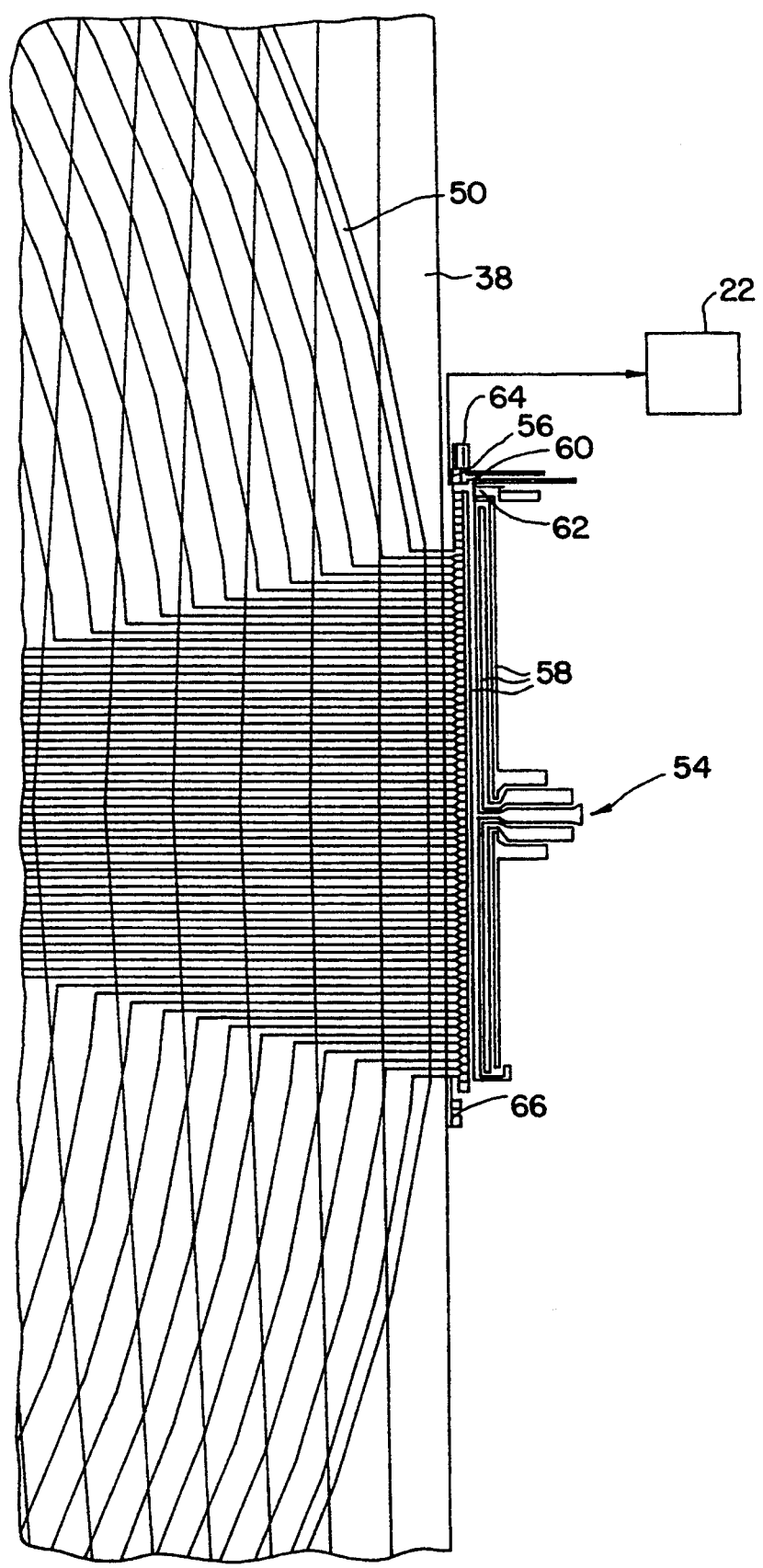
FIG. 6 is an enlarged, detail view of the detector/charge transport mechanism of FIG. 2 showing the readout circuitry.

Various components of the readout circuitry 54 associated with the readout port areas 32 are shown in FIG. 6. At the end of a selected exposure cycle (integration period), charge is clocked by serial register 46 to the readout circuitry 54 comprised of an output gate 56, reset transistor 60, summing electrode 62, and charge detection amplifier 64. The readout circuitry 54 processes the charge to produce an output signal. The resulting output signal 20 is transmitted to an analyzer 22 for further signal processing. The charge is transferred along register 46 using three phase clocking electrodes fed by aluminum busses 58. The charge can be clocked from the bottom of serial register 46 to the top (as shown in FIG. 6) or from the center towards both ends. In this regard, it will be appreciated that corresponding elements 24 from each of the quadrants shown in FIGS. 2 and 3, e.g., the outermost elements 24, receive corresponding portions of the fringe pattern. Accordingly, the charge from corresponding elements 24 of each quadrant are summed, electrically or through data processing, to resolve the fringe pattern. The reset transistor 60 is used to reset the serial register 46, summing electrode 62, charge detection amplifier 64, transfer gate electrode 66 and related readout components for each cycle of integration and charge detection.

Operation of the detection/charge transport mechanism 18 begins with an integration period during which the fringe pattern output by the interferometer is received by the detection portion 23. Each of the elements 24 of the detector portion 23 converts that portion of the fringe pattern it receives into a representative charge signal. The charge transport portion 23 operates after the integration period to produce the stepped potential gradient that is used to move or sweep the charge produced by each of the elements 24 along the corresponding notch 24 to one of the readout ports 32. Following the charge transport period, the readout period begins. Readout involves transferring charge from each of the elements 24 to register 46 using the transfer gate electrode 66. Subsequently, the respective charges produced by each of the elements 24 is clocked out of the register 46 to the analyzer 22.

Figure 7:
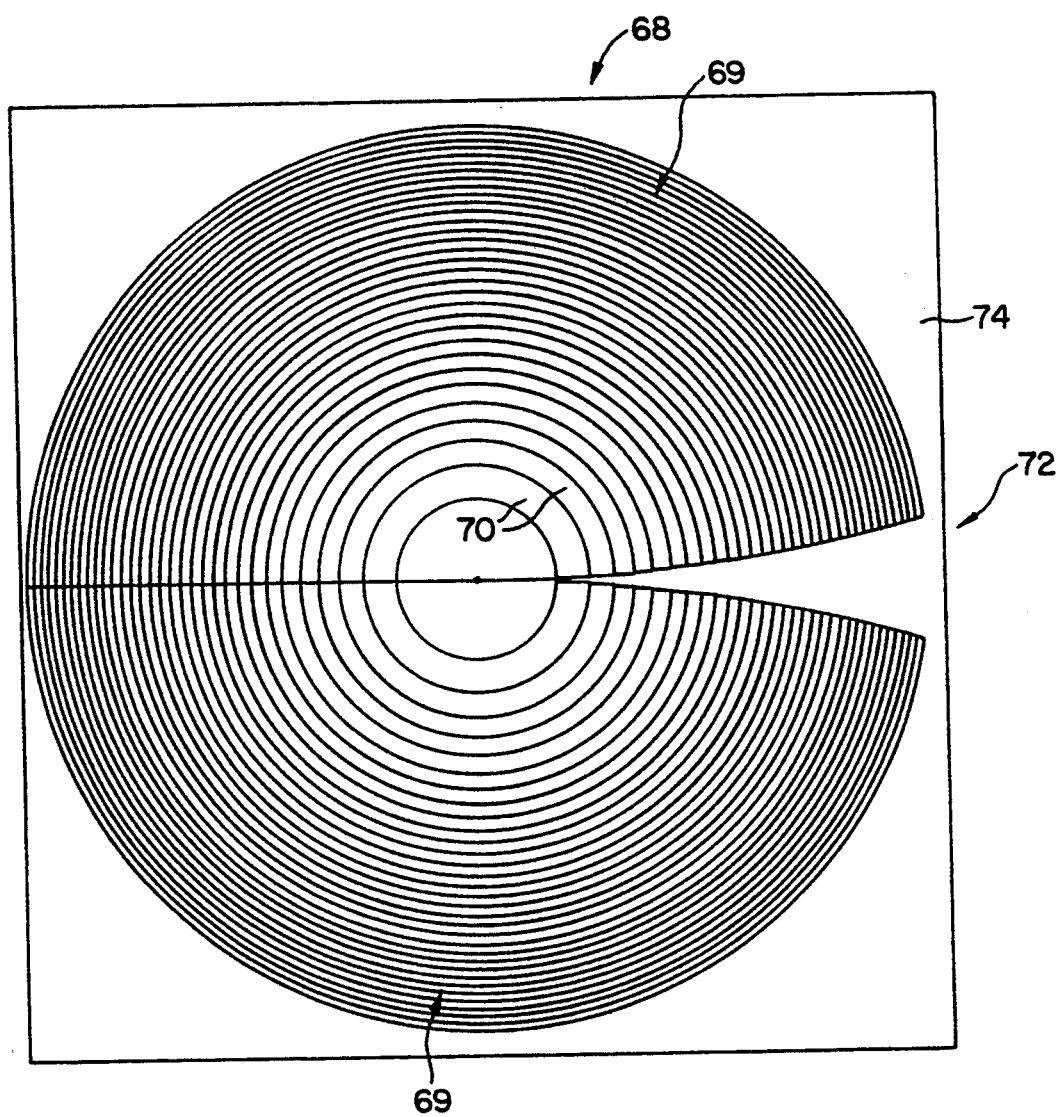
FIG. 7 is a top view of an alternative detector/charge transport mechanism constructed in accordance with the present invention.

Referring to FIG. 7, an alternative detector/charge transport mechanism embodiment is generally identified by reference numeral 68. The detector/charge transport mechanism 68 includes a detector portion 69 that includes a plurality of substantially semi-circular radiation sensitive elements 70 that each terminate in a readout port area 72. The remainder of the detector portion 69 is provided with a light shield 74. The output circuitry and related components are substantially identical to that described above and the description will therefore not be repeated.

Figure 8:
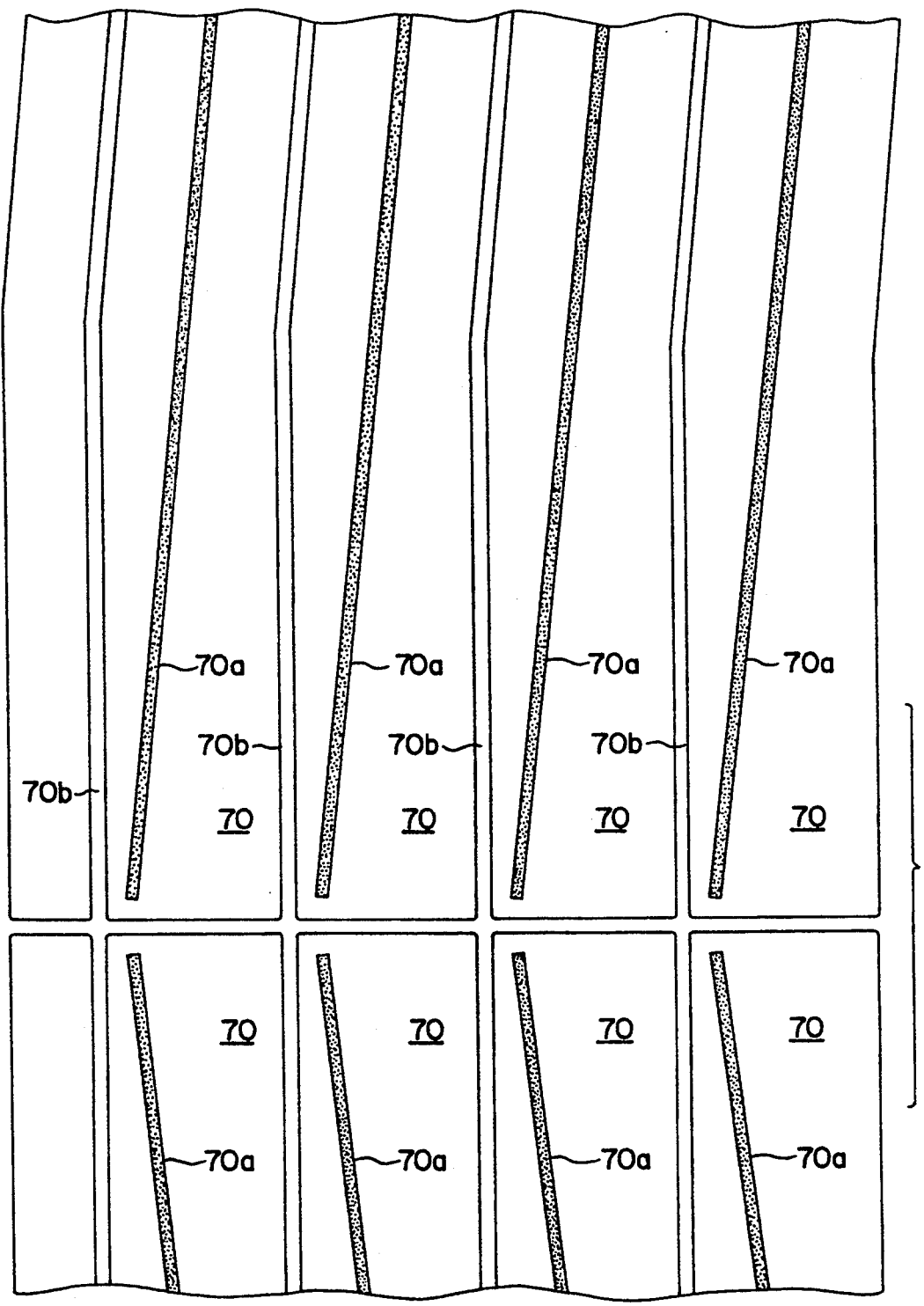
FIG. 8 is an enlarged, detail illustration of a portion of the detector/charge transport mechanism of FIG. 7 showing angled mini-channels or notches.

As shown in FIG. 8, the elements 70 include mini-channels 70a that are at an angle to the potential field to avoid or reduce the need for the charge produced by the elements 70 having to travel at a right angle to the potential field as well as to provide a reduced path length. This is especially useful at the ends of the elements 70 furthest from the readout port where the portions of channel stops 70b defining the lateral extent of the elements are substantially parallel to one another and substantially perpendicular to the applied potential field. In this region, charge must travel a path that is substantially perpendicular to the applied field, absent the mini-channels 70a. Alternatively or in addition to angling the notches 52 relative to the potential field, the channel stops can be oriented so as not to be at a right angle to the potential field and thereby define a path for charge migration that is not perpendicular to the field. As yet a further alternative, on certain applications the charge produced at the ends of the elements that are furthest from the readout port may not be critical. In this case, the noted end region can be shielded and, as a consequence, the need for charge to travel in a direction that is substantially perpendicular to the potential field is substantially avoided.

Figure 9:
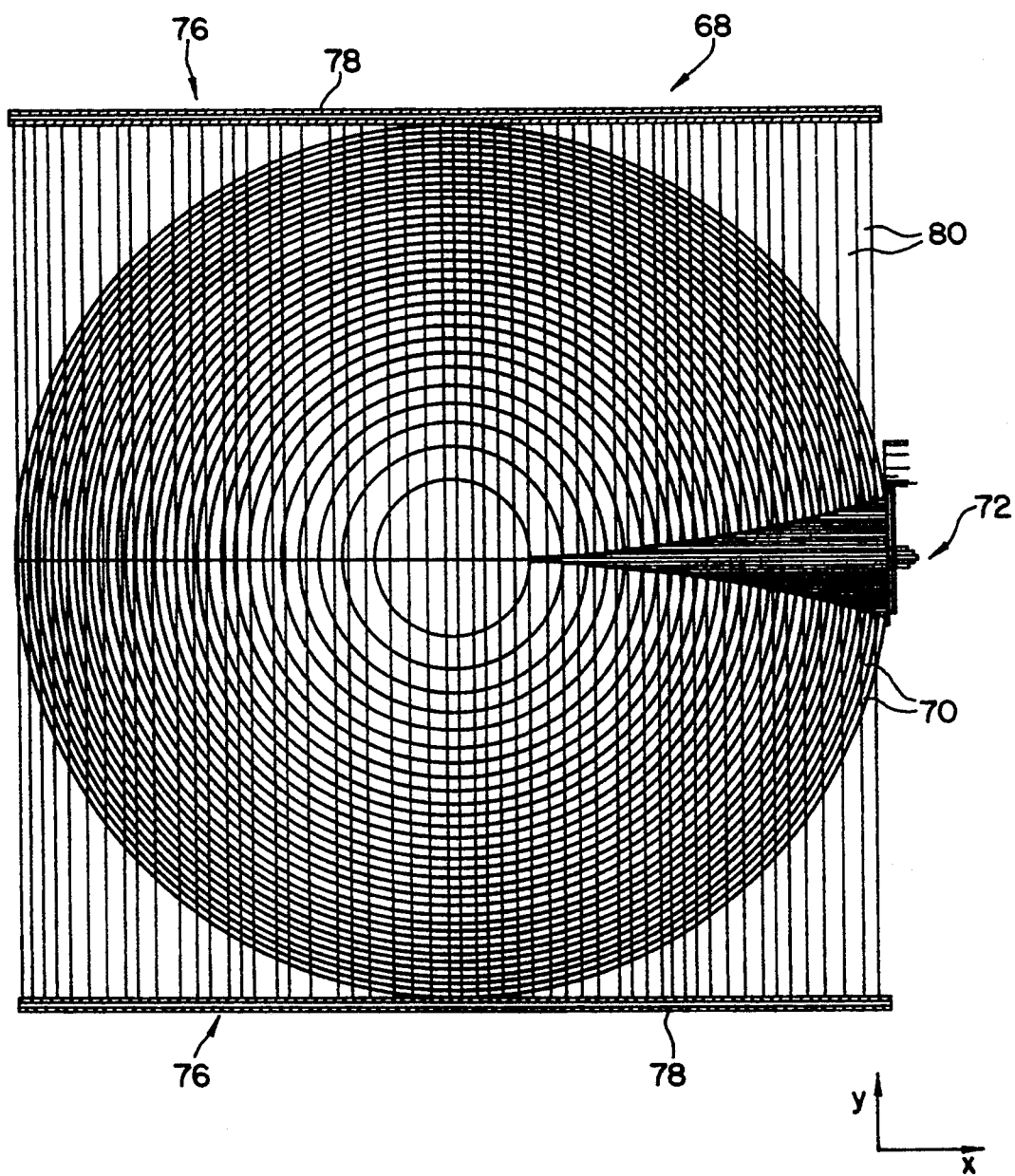
FIG. 9 is a top view of a portion of the detector of FIG. 7.

A charge transport mechanism 76 for transporting charge through the elements 70 to readout port area 72 is shown in FIG. 9. The mechanism 76 comprises three phase clocking electrodes 80 that are fed by aluminum busses 78 and substantially equally spaced from one another. The clocking electrodes 80 are formed from polysilicon layers, as are the elements 70. At the end of a selected exposure cycle (integration period), the clocking electrodes 80 are clocked from left to right, as viewed in FIG. 9, thereby impressing a charge sweeping action on the elements 70 so that charge is urged to the readout port area 72. Further, because the potential field produced by the clocking electrodes 80 furthest from and closest to the readout port 72 upon application of the clocking signal, is primarily directed in the x-direction and the path that charge must travel in these areas has a substantial y-component due to the substantially semi-circular shape of the elements 70, the clocking signals are applied to the detector portion 69 for a longer period of time at both the beginning and end of a sweep cycle than in the middle portion of the detector portion 69 where there is less of a y-component in the path that the charge must travel. Stated differently, the rate at which the clocking signals and the rate at which the resulting potential field produced by the charge transport mechanism 76 sweep across the detector portion 69 is varied to allow sufficient time for charge that was generated furthest from the read out port(s) to move to the readout port(s). Even allowing for such reduced clocking rates at both the beginning and end of the sweep period, it is estimated that a total clocking period for a 1 cm diameter detector 68 of less than 2 milli-seconds can be achieved and that this will be adequate for many applications.

As an alternative to varying the rate at which the clocking signals are applied to the substantially equally spaced clocking electrodes 80, a substantially constant rate clocking signal can be applied to clocking electrodes that are spaced more closely in the areas adjacent to the detector portion 69 in which charge must travel more transverse to the potential field. As a consequence, charge in these areas is given a longer time to move the necessary greater distance in this portion of the detector.

The present invention has a number of advantages over conventional devices and charge transport mechanisms. First, charge transport mechanisms constructed in accordance with the present invention that convey charge to the readout port areas with reduced production of thermally generated electrons. Additionally, the present invention provides areas associated with known charge transport mechanisms. Further, in accordance with the present invention, charge transport mechanisms can be constructed using polysilicon fabrication processes which are compatible with fabrication processes normally used in constructing related signal detector components. Moreover, the present invention provides improved charge transport efficiency in curved or bent detector devices, which necessarily require that charge move in two dimensions. In addition, the present invention provides detection in critical areas that other detection/charge transport mechanisms are incapable or limited in providing detection. For instance, both of the disclosed detection/charge transport mechanisms are capable of detecting the center fringe of the fringe pattern output by a Fabry-Perot interferometer. Additional advantages will be apparent to those skilled in the art.

While various embodiments of the present invention have been described in detail, it is apparent that further modifications and adaptations of the invention will occur to those skilled in the art. For example, the charge transport mechanisms described above can be adapted for use in certain time-specific detection applications such as rangefinder applications. That is, charge can be conveyed from a collector, as described above, to a clocked receiver of a conventional rangefinder so as to provide large area collector capability in connection with a high frequency receiver. However, it is to be expressly understood that such modifications and adaptations are within the spirit and scope of the present invention.

What is claimed is:

1. An apparatus for use in a signal information system, comprising:
    detector means for receiving a radiation signal and generating an electrical charge in response to said radiation signal, said detector means includes a readout port and extends over a defined area; and
    stepped potential gradient means for producing a stepped potential gradient to convey charge from said detector means to said readout port, said stepped potential gradient having a first potential at a first portion of said detector means, a second potential that is different than said first potential at a second portion of said detector means, and a potential discontinuity between said first potential and said second potential.

2. An apparatus, as claimed in claim 1, wherein:
    said stepped potential gradient means comprises means for providing a plurality of substantially discrete potentials.

3. An apparatus, as claimed in claim 1, wherein:
    said stepped potential gradient means comprises means for providing a plurality of substantially discrete potentials that is at least partly located outside said defined area.

4. An apparatus, as claimed in claim 1, wherein:
    said stepped potential gradient means comprises a voltage divider.

5. An apparatus, as claimed in claim 1, wherein:
    said stepped potential gradient means includes a voltage divider that is at least partly located outside said defined area.

6. An apparatus, as claimed in claim 1, wherein:
    said stepped potential gradient means comprises a serpentine strip of resistive material.

7. An apparatus, as claimed in claim 1, wherein:
    said stepped potential gradient means comprises a plurality of electrodes underlying said defined area of said detector means.

8. An apparatus, as claimed in claim 1, wherein:
    said stepped potential gradient means includes means for providing a plurality of substantially discrete potentials and a plurality of electrodes for applying said plurality of discrete potentials to said detector means.

9. An apparatus, as claimed in claim 1, wherein:
    said detector means and said stepped potential gradient means each include a material in common.

10. An apparatus, as claimed in claim 1, wherein:
    said detector means and said stepped potential gradient means each include a polysilicon material.

11. An apparatus, as claimed in claim 1, wherein:
    said detector means includes a first surface upon which said radiation signal is incident and at least a portion of said stepped potential gradient means underlies said first surface.

12. An apparatus, as claimed in claim 1, wherein:
    said stepped potential gradient means includes means for reducing dark current accumulation.

13. An apparatus, as claimed in claim 1, wherein:
    said stepped potential gradient means includes an n-type surface and means for inverting said n-type surface to a p-type surface.

14. An apparatus, as claimed in claim 1, wherein:
    said stepped potential gradient means includes an n-type surface and means for varying said stepped potential gradient to invert said n-type surface to a p-type surface.

15. An apparatus, as claimed in claim 1, wherein:
    said stepped potential gradient means includes means for reducing a time constant.

16. An apparatus, as claimed in claim 1, wherein:
    said stepped potential gradient means includes one of a capacitor divider and a resistor divider.

17. An apparatus, as claimed in claim 1, wherein:
    said stepped potential gradient means includes a curved electrode.

18. An apparatus, as claimed in claim 1, wherein:
    said stepped potential gradient means includes a first straight electrode and a second straight electrode that is at an angle to said first straight electrode other than parallel.

19. An apparatus, as claimed in claim 1, wherein:
    said defined area includes the center of a circular area.

20. An apparatus, as claimed in claim 1, wherein:
    said detector means includes a pixel with a pair of substantially parallel channel stops and a notch channel that is located in between said channel stops and at an angle to said channel stops that is other than parallel.

21. An apparatus, as claimed in claim 1, wherein:
    said detector means comprises a plurality of electrically separated regions of radiation sensitive material, said regions being arranged in a concentric, annular configuration.

22. An apparatus for use in a signal processing system, comprising:
    means for receiving a radiation signal and generating an electrical charge in response to said radiation signal, said means for receiving including a first side, a second side, and a readout port, located adjacent said second side, for communicating said electrical charge with other componentry; and
    means for applying a potential signal to said means for receiving that sweeps from said first side to said second side of said means for receiving at a varying rate.

23. An apparatus, as claimed in claim 22, wherein:
    said means for applying a potential signal includes means for producing a clocking signal with a varying rate.

24. An apparatus, as claimed in claim 22, wherein:
    said varying rate increases as said potential signal sweeps from said first side to said second side of said means for receiving.

25. An apparatus, as claimed in claim 22, wherein:
    said varying rate decreases as said potential signal sweeps from said first side to said second side of said means for receiving.

26. An apparatus, as claimed in claim 22, wherein:
    said means for receiving includes a curved pixel.

27. An apparatus, as claimed in claim 22, wherein:
    said means for receiving includes a plurality of pixels in an annular configuration.

28. An apparatus, as claimed in claim 22, wherein:
    said means for receiving includes a pixel with a pair of substantially parallel channel stops and a notch channel that is located between said channel stops and at an angle to said channel stops that is other than parallel to said channel stops.

29. An apparatus, as claimed in claim 22, wherein:
    said potential signal extend in a first direction and said means for receiving includes a pixel that extends from a first terminal end to a second terminal end and has a first channel stop and a second channel stop, wherein said first channel stop and said second channel stop are other than perpendicular to said potential signal.

30. An apparatus for use in a signal processing system, comprising:
  detector means for receiving a radiation signal and generating an electrical charge that is representative of said radiation signal, said detector means includes a plurality of concentric and at least partly annular pixels, and a first side, a second side, and a readout port located adjacent said second side; and
  means for applying an electrical field to said detector to move said electrical charge towards said readout port, said means includes a plurality of electrodes that underlie said detector means.

31. An apparatus, as claimed in claim 30, wherein:
at least one of said plurality of concentric and at least partly annular pixels extends over an arc that is less than or equal to 180°.

32. An apparatus, as claimed in claim 30, wherein:
at least one of said plurality of concentric and at least partly annual pixels extends over an arc that is less than or equal to 90°.

33. An apparatus, as claimed in claim 30, wherein:
said electrical field includes a stepped electrical field that has a first potential at a first portion of said detector means, a second potential that is different than said first potential at a second portion of said detector means, and a potential discontinuity between said first potential and said second potential.

34. An apparatus, as claimed in claim 30, wherein:
said means for applying includes means for causing said electrical field to sweep from said first side to said second side at a varying rate.

35. An apparatus, as claimed in claim 30, wherein:
said detector means has a first surface upon which said radiation signal is incident and at least a portion of said means for applying underlies said first surface.

36. An apparatus, as claimed in claim 30, wherein: said detector means and said means for applying each include polysilicon.

37. An apparatus, as claimed in claim 30, wherein:
at least one of said pixels includes a first channel stop, a second channel stop that is substantially parallel to said first channel stop, and a notch channel that is located between said first channel stop and said second channel stop and oriented at an angle other than parallel to said first channel stop and said second channel stop.

38. An apparatus, as claimed in claim 30, wherein:
said means for applying includes means for reducing dark current.

39. An apparatus, as claimed in claim 30, wherein:
said plurality of electrodes form a chevron pattern.

40. An apparatus, as claimed in claim 30 wherein:
said detector means includes a charge-coupled device (CCD).

41. An apparatus for use in a signed processing system, comprising:
  a detector for receiving a radiation signal and generating an electrical charge that is representative of said radiation signal, said detector includes a readout port; and
  a potential gradient generator for applying a potential gradient to said detector to cause said electrical charge to move toward said readout port, said potential gradient generator includes a voltage divider that is laterally displaced from said detector and produces a plurality of substantially discrete voltages, and a plurality of tines, underlying said detector, for applying said plurality of substantially discrete voltage to said detector.

42. An apparatus, as claimed in claim 41, wherein:
said detector includes a curved CCD.

43. An apparatus, as claimed in claim 41, wherein:
said voltage divider includes a polysilicon resistor.

44. An apparatus, as claimed in claim 41, wherein:
said detector and potential gradient generator each include polysilicon.

45. An apparatus, as claimed in claim 41, wherein:
said potential gradient includes one of the following: a stepped potential gradient and a multi-phase clock signal with a varying rate.

* * * * *